United States Patent [19]

St-Jean

[11] 4,157,496

[45] Jun. 5, 1979

[54] CIRCUIT FOR TESTING PROTECTION DEVICES

[76] Inventor: Guy St-Jean, 324 Whimbey, St-Lambert, Quebec, Canada, J4R 2A3

[21] Appl. No.: 853,209

[22] Filed: Nov. 21, 1977

[51] Int. Cl.² .......................................... G01R 31/02
[52] U.S. Cl. .................................... 324/28 R; 324/72
[58] Field of Search .......... 324/28 R, 28 CB, 28 CR, 324/72, 51

[56] References Cited

U.S. PATENT DOCUMENTS

| | | | |
|---|---|---|---|
| 2,888,639 | 5/1959 | Petermichl et al. | 324/28 R |
| 3,064,183 | 11/1962 | Slamecka | 324/28 R |
| 3,373,350 | 3/1968 | Reece | 324/28 R |
| 3,467,857 | 9/1969 | Longworth | 324/28 R |
| 3,515,982 | 6/1970 | Longworth | 324/28 R |

*Primary Examiner*—M. Tokar

[57] ABSTRACT

Process and test generator for simulating the operation requirements of a protection device for an AC low, high or very high voltage power network. The generator comprises a voltage branch connected to the protection device for producing a sparkover voltage and an injection branch in parallel with this voltage branch for producing across the device under test a follow current of a value corresponding to the value of the current injected by the power network through this protection device when the latter is in operation. A resonant branch is connected to the injection branch for producing across the terminals of the protection device an alternating voltage corresponding to the voltage of the power network. The generator can also stimulate a long power transmission line and repetitive sparkovers of the device under test. Furthermore, a sparkover of the device can be performed at any phase angle of the power network voltage. The process and the generator are particularly useful for the testing surge arresters.

22 Claims, 12 Drawing Figures

CIRCUIT FOR TESTING PROTECTION DEVICES

The present invention relates to a test generator which is capable of reproducing the operation requirements of protection devices useful in alternating low, high or very high voltage power systems or networks, and according to the standard operation requirements. More particularly, the present invention concerns a generator which simulates the duty cycle of protection devices, such as arresters, fuses or current limiting breakers, as well as the process of simulation carried out by this generator.

As it is known, the essential function of any protection device is to prevent apparatus connected to a supply power system, and the power system itself, from being damaged, often irremediably, by overvoltage surges created usually by a commutation fault, lighting or any other cause. From all protection devices known so far, the test bench simulation of the operating conditions of the surge arresters is the most difficult one to achieve. The generator according to the present invention is particularly well adapted to reconstitute or determine the operating conditions of surge arresters, and this at a cost substantially less than that relative to standard test generators.

In the case of arresters, the test generator has to simulate the lightning pulse or the overvoltage surge which causes the sparkover and conduction of the arrester, as well as the alternating power system tied to it. Thus, the duty cycle test of an arrester consists of having it to perform the complete task that it must accomplish the most frequently when in normal operation. The device is usually connected between a live conductor and ground, in parallel with and close to another apparatus that requires protection by limiting the voltage across its terminals to a predetermined value. When the voltage on the conductor reaches a certain threshold value V, due to a lightning impulse or an internal voltage surge in the network, the arrester sparks over and causes a momentary short-circuit to decrease the voltage. At this instant, a current impulse of the order of a few microseconds, caused by this overvoltage surge, passes through the arrester.

Secondly, the function of the arrester is to relieve gradually the short-circuit that it created, in order to allow the conductor and the power system to recover their initial condition. This operation usually can be carried out with non-linear resistances and spark-gaps which force the current called "follow current" to zero and interrupt it while maintaining the total arrester voltage below the sparkover voltage V.

The third function of the arrester is to isolate the conductor from ground against the alternating voltage of the power system following interruption of the follow current.

The simulation process and the test generator according to the present invention allow the carrying out of the different functions of arresters or other protection devices; and performing tests that are similar to those of known testing circuits, but by using an A.C. source costing 2 to 4% of the cost of the classical sources. Thus, the present generator allows the realization of tests at very high voltage levels that would not be economically attainable with classical circuits, and the achievement of tests at low voltages with a compact and easily transportable generator.

More specifically, the present invention resides in a test generator which simulates the operating conditions of a protection device in a low, high or very high A.C. voltage power system. This test generator comprises a single voltage source; a voltage branch connected to the protection device for producing a sparkover voltage; an injection branch in parallel with said voltage branch for producing a follow current of a value corresponding to the value of the current injected by said power system in the protection device when the latter is in normal operation, and a resonant branch connected to the said injection branch for producing across the terminals of the protection device under test an alternating voltage corresponding to the voltage of the power system.

The present invention also concerns the simulation process which is carried out by the test generator described above.

Preferred embodiments of the present invention will be hereinafter described with reference to the accompanying drawings, wherein.

Figure 1:
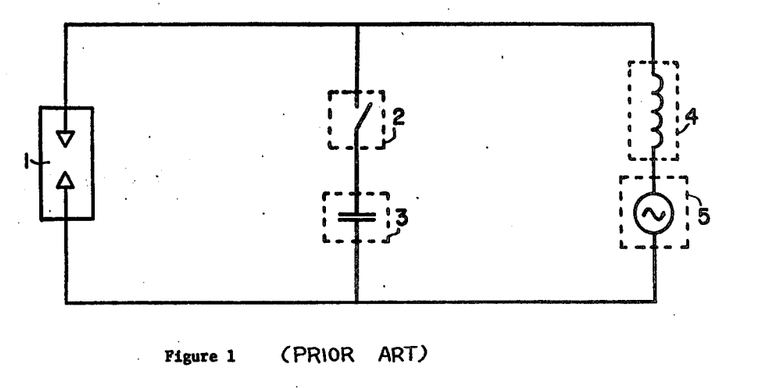
FIG. 1 shows an arrangement of a prior art testing generator.
Figure 2:
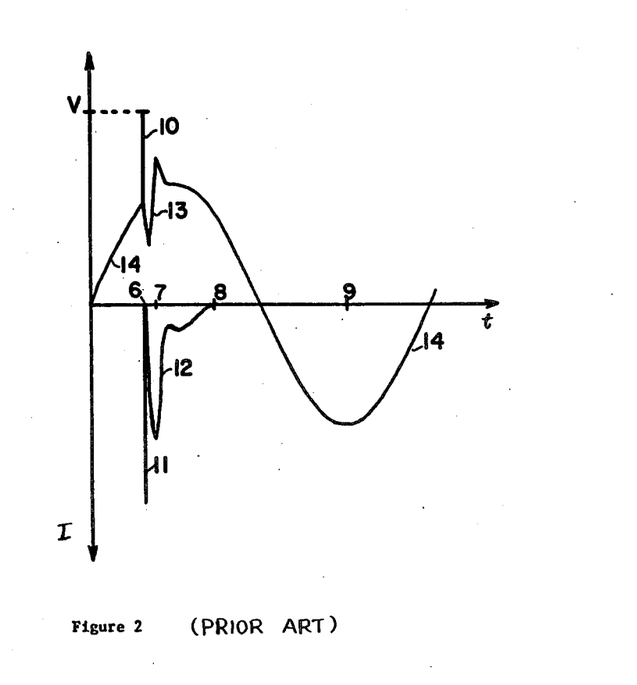
FIG. 2 shows the waveforms of currents and voltages produced by the test generator of FIG. 1.

FIG. 1 illustrates a prior art arrangement of a test generator to perform duty cycle tests on an arrester, designated by 1, and FIG. 2 shows the waveforms produced by the generator of FIG. 1. Initially, the arrester 1 is an open circuit and is exposed to the rated sinusoidal voltage 14 of a power system. At a phase angle of the voltage prescribed by standards and at the instant 6, the switch 2 is closed; then, the precharged capacitance 3 produces across the arrester terminals a voltage 10 sufficient to cause sparkover. At this moment, a current pulse 11 generated by the capacitance 3 passes through the arrester and the latter short-circuits the alternating source 5 which will supply a follow current 12 through the inductive impedance 4. In this type of arrangement, the alternating source 5 used is generally a generator or a power transformer.

The shape of the follow current 12 which reaches its peak value at point 7 depends mainly on the voltage of source 5, the voltage 13 across the arrester, this voltage 13 may become higher than the source voltage, and the impedance of the loop formed by elements 1, 4 and 5. When the current 12 reaches a null value, it is interrupted at instant 8 and the rated voltage 14, which reaches its peak value at point 9, reappears across the terminals of the arrester which should not spark over again.

It should be noted that the curves shown in the FIG. 2 are those for a "current limiting" type arrester the main characteristic of which is to produce a substantially high gap voltage to enable interruption of the follow current before the zero-crossing of the voltage waveform, ususally at 60 Hz.

Figure 3:
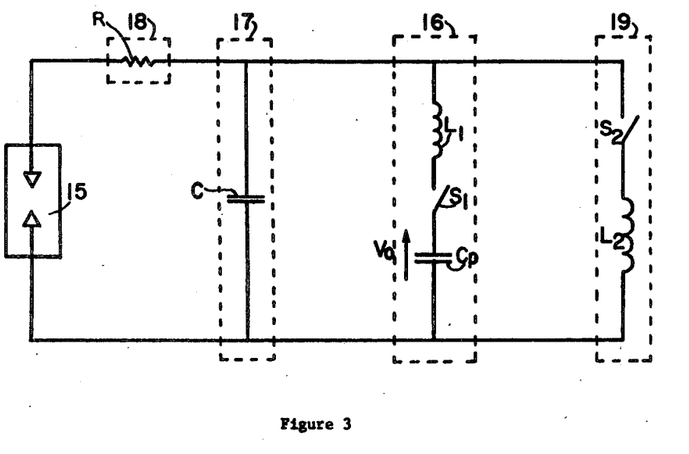
FIG. 3 illustrates an embodiment of the generator for testing arresters, according to the present invention.

FIG. 3 illustrates schematically an embodiment of the generator according to the present invention, capable of performing tests not only on "current limiting" type arresters, described above, but on all types of surge arresters. The "current limiting" type is only considered because of its greater complexity and its outstanding application at very high voltage levels.

As shown in FIG. 3, the test generator is made of three parallel branches 16, 17 and 19 and one branch 18 in series with the arrester 15. The branch 16 is called the injection branch because it generates the follow current which is injected into the arrester 15. This injection branch 16 is made up of a main capacitor $C_p$ precharged at a voltage $V_o$ and in series with a switch $S_1$ and an inductance $L_1$ to limit the current in this branch. A branch 17 called "voltage branch", having at least one capacitance, supplies the voltage necessary to ignite the arrester 15. A third branch 19 called "resonant branch" is made up of a large inductance $L_2$ in series with a switch $S_2$. It is so called because it forms, when in series with the injection branch 16, a resonant circuit at a frequency usually of 60 Hz. As to the resistive branch 18, mounted in series with the arrester 15, it operates to control the flow of the follow current generated by the injection branch 16. It should be noted that this resistive branch 18 could be inserted between the injection branch 16 and the voltage branch 17 as well.

Figure 4:
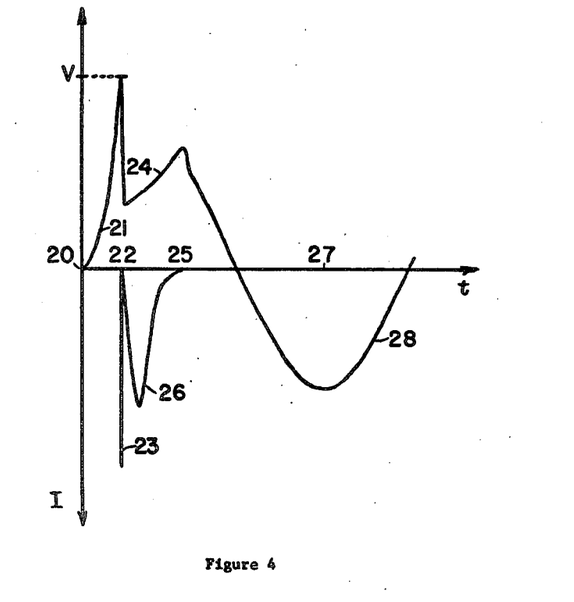
FIG. 4 shows the waveforms of currents and voltages produced by the generator of FIG. 3.

To perform a duty cycle test of the arrester 15, the switches $S_1$ and $S_2$ are initially open. At first, switch $S_1$ is closed, and a current then flows from the injection branch 16 to the voltage branch 17 where will build up, across the capacitor C, the voltage necessary to ignite the arrester at instant 22 as shown in FIG. 4. In this figure, one should also note that the impulse waveform 23 of the initial current corresponds to the sparkover voltage V of the arrester. This impulse 23 is in agreement with that required by the standards and identical to the impulse 11 (FIG. 2) produced by the prior art generator of FIG. 1.

As shown in FIG. 4, the voltage across branch 17 starts initially along line 21 and increases up to the sparkover voltage V. Following the sparkover, the voltage branch 17 discharges in the loop made up of 17, 18 and 15 (FIG. 3), forming the required current impulse shown by 23. This impulse 23 rapidly discharges the voltage branch 17, following which the injection branch 16 forces the follow current 26 through the series resistive branch 18, which regulates it, and through the arrester 15. The follow current 26, the shape of which depends mainly on the opposing values of the arrester voltage 24 and the injection branch voltage 16, is interrupted at point 25.

At this moment or a little prior to it, switch $S_2$ of branch 19 is closed and makes a series circuit with the injection branch 16. Thus, a resonant circuit if formed which operates at the network frequency of 60 Hz. The voltage appearing across the terminals of the resonant branch 19, from moment 25 onward, is represented by the curve 28, thereby simulating the rated voltage of the power network or of the source 5 (FIG. 1) of the prior art circuit and corresponds to the voltage 14 shown in FIG. 2. It should be noted that, under the influence of voltage 28, the arrester must not switch on or sparkover again.

The switching moment of switch $S_2$ of the resonant branch 19 falls generally between the closing instant of switch $S_1$ of the injection branch 16, at time 20, and the interruption of the follow current at instant 25. However, because the rated voltage 28 at instant 25 is normally less than its maximum value determined at instant 27, it is advocated to close switch $S_2$ earlier. In this way, the inductance $L_2$ of the resonant branch 19 can be sufficiently charged up in current to allow it to give back to capacitor $C_P$ of branch 16, at the instant 27, all the energy necessary to produce across this capacitor a greater voltage than the one at instant 25. With this in view, it is provided for the closing of switch $S_2$ simultaneously with switch $S_1$ or even for the replacement of $S_2$ by a short-circuit, for tests carried out on particular types of arresters.

With the generator shown in FIG. 3, tests have been performed on arresters operating at a normal peak voltage of 150 kV, 60 Hz. The value of each component forming the generator was:

$L_1 = 585$ mH
$L_2 = 1.76$ H
$C_P = 3.0$ μF
$C = 0.33$ μF
$R = 400$ Ω

The capacitor $C_P$ has been charged up to a voltage $V_o = 300$ kV, say a stored energy of 135 kJ. When switch $S_1$ is closed, the injection branch 16 charges the capacitor C (branch 17) in order to produce across the arrester 15 a peak voltage V = 230 kV which makes it spark over, and the capacitor C discharges through the arrester 15 with a current impulse of 2 kA (current 23 of FIG. 4). Once the arrester has been ignited, a follow current (current 26) of 180 A (peak) passes through the arrester. The switch $S_2$ having been replaced by a short-circuit, the arrester is now exposed to a rated voltage of 150 kV, and 60 Hz, under which it must not spark over again. We obtain in this case the voltage and current waveforms shown in FIG. 4 and which are conformed with the required standards.

Figure 5:
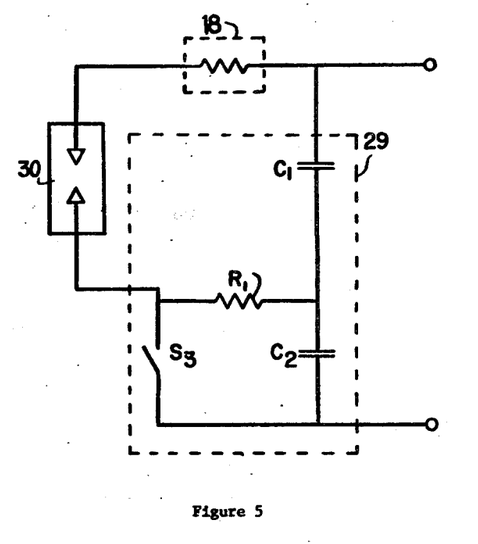
FIG. 5 is a variant of the voltage branch of the generator shown in FIG. 3.

FIG. 5 is a variant of the generator shown in FIG. 3, in which the voltage branch 17 is replaced by the voltage branch 29, in the case where high amplitude current impulses are required across the arrester 30. Its operation is as follows: when the voltage across capacitor $C_1$ reaches the sparkover value, the arrester 30 conducts and a momentary current flows in the loop made up of the capacitor $C_1$, the resistive branch 18, the arrester 30 and the resistance $R_1$. Immediately after, the switch $S_3$ is closed or automatically sparks over due to the total voltage across $R_1$ and $C_2$, and the arrester is fed with the sum of the voltages on $C_1$ and $C_2$, in series, to produce a very high current in the loop formed by $C_2$, $C_1$, 18, 30 and $S_3$. At this moment a virtually small current flows in resistance $R_1$ which has a very high ohmic value.

Figure 6:
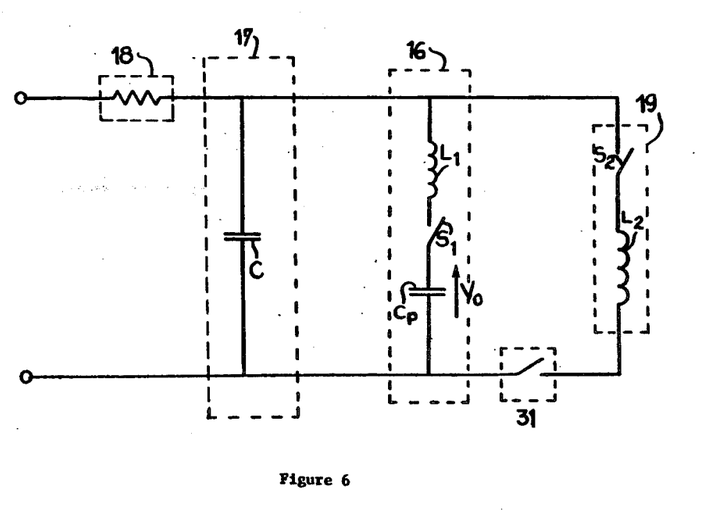
FIG. 6 shows a further embodiment of the test generator of the present invention, for repetitive tests on arresters.
Figure 7:
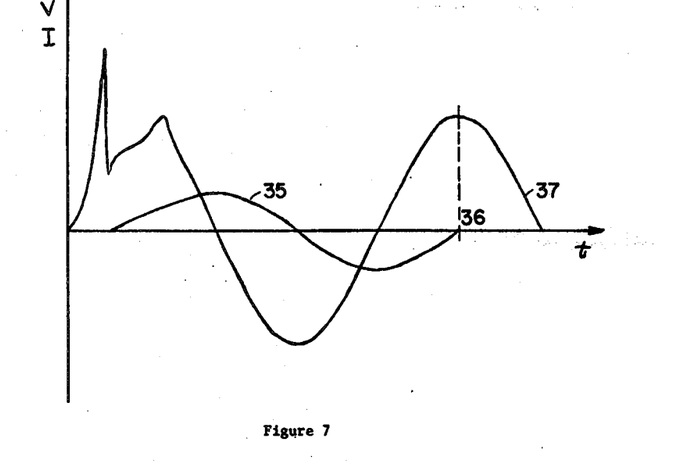
FIGS. 7 and 8 show the waveforms resulting from the opertion of the generator of FIG. 6.

It is often required by the standards that repetitive tests be performed on arresters. The generator circuit of FIG. 6, which is a variant of the circuit illustrated in FIG. 3, allows to carry out such repetitive tests. The method consists of using an interruptor 31 in the resonant loop formed by the resonant branch 19 and the injection branch 16. The function of the interruptor 31 resides in switching off current 35, shown in FIG. 7, of this loop at its zero value 36 which corresponds to the maximum value of the voltage 37 of the resonant branch 19. This voltage 37 has then the same polarity as the initial charged voltage of capacitor $c_P$ of the injection branch 16. This technique enables to keep in the main capacitor $C_P$ all of the energy that it has not lost to the arrester during a test. The capacitor $C_P$ can therefore be recharged more rapidly to its full initial value, thus allowing a higher repetition rate of the duty-cycle tests.

Figure 8:
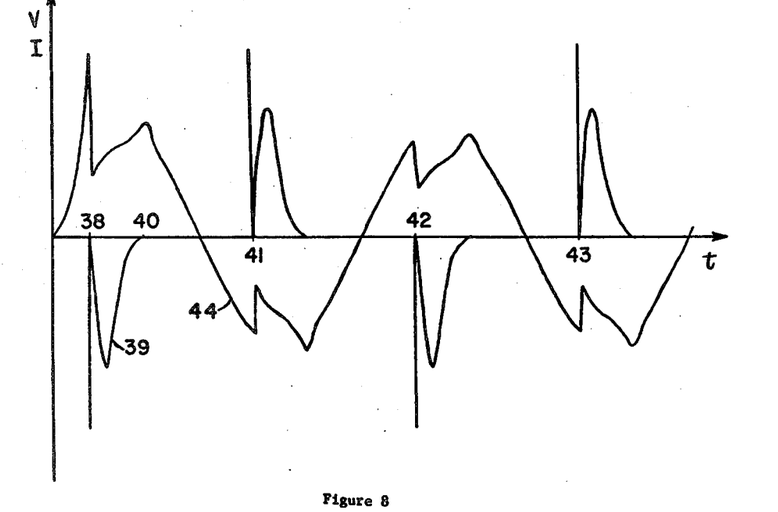

There is another case where the purpose of the repetitive tests is to simulate the different operating conditions of an arrester that can occur on a power system submitted to forced repeated overvoltages at the system frequency. The voltage and current waveforms resulting from those repetitive tests are shown in FIG. 8. In this case, the first sparkover of the arrester is produced at instant 38 (instant 22 in FIG. 4) by the voltage branch 17, and the follow current 39 is interrupted normally at instant 40 (instant 25 in FIG. 4). Subsequently, the sinusoidal voltage 44 (voltage 28 in FIG. 4) of the resonant branch 19 causes sparkover of the arrester at each instant 41, 42, 43 where it reaches the critical sparkover value and produces each time a follow current which must be interrupted.

Figure 9:
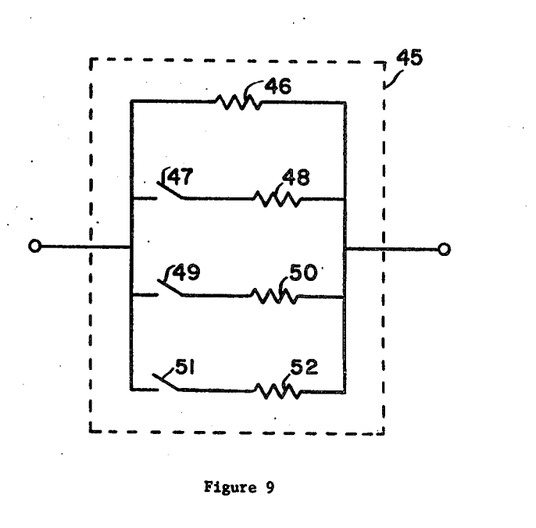
FIG. 9 is a variant of the resistive branch of the generator illustrated in FIG. 6.

During these repetitive tests, the energy stored in the main capacitor $C_P$ decreases with each discharge in the arrester, so that the subsequent impulses of follow current will gradually decrease in amplitude. In order to make these current impulses more uniform, the resistive branch 18 is replaced by the circuit 45 as shown in FIG. 9. In circuit 45, a high ohmic resistance 46 is used to limit the current during the first conduction period and this resistance is subsequently progressively reduced at the outcome of each test. This can be accomplished by closing the switches 47, 49 and 51 respectively after each conduction period to progressively lower the total resistance through the addition of parallel resistances such as 48, 50 and 52.

Figure 10:
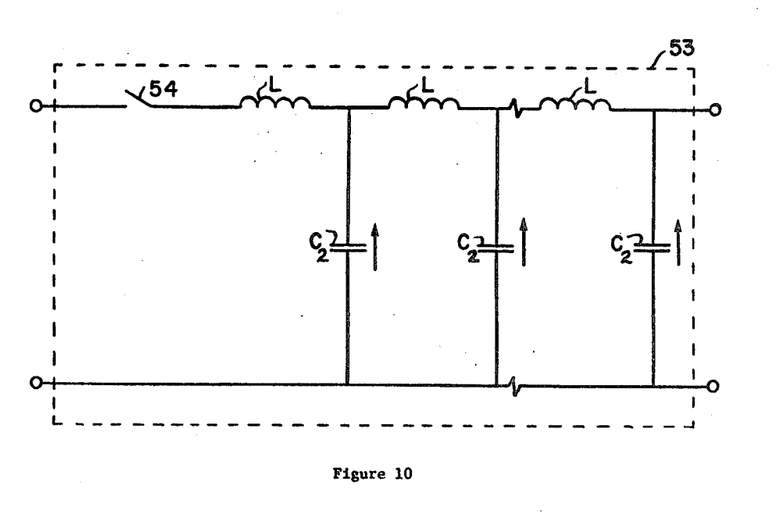
FIG. 10 is a variant of the injection branch of the test generator according to the present invention, for the simulation of a long transmission line.

Tests simulating the case where an arrester is connected to a long transmission line can also be performed. In this case, the injection branch 16 is replaced by the circuit 53 shown in FIG. 10. This circuit is made up of a number of inductors L and of capacitors $C_2$, the latter being precharged to simulate a charged transmission line. The switch 54 is placed in series with this artificial line on the side of the voltage branch 17.

Figure 11:
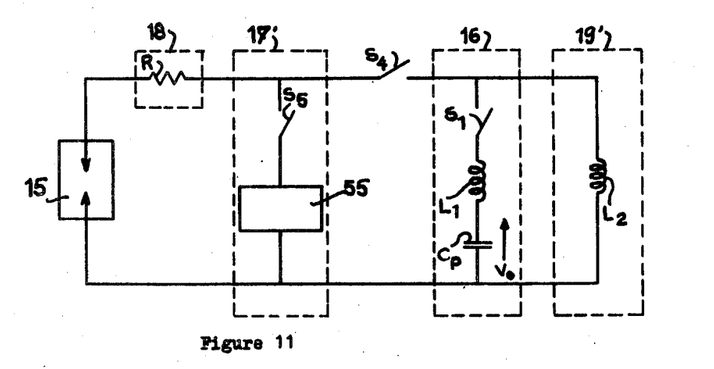
FIG. 11 shows another embodiment of the test generator according to the present invention.
Figure 12:
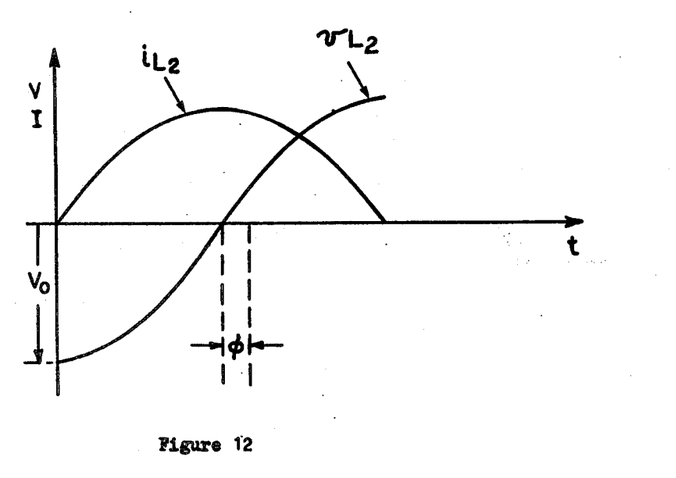
FIG. 12 shows the waveforms generated by the resonant set of the generator of the FIG. 11.

FIG. 11 shows a variant of the generator illustrated in FIG. 3. This variant allows to cause sparkover of the arrester at any phase angle $\phi$ of the 60 Hz voltage waveform of a power system, this waveform being simulated with the injection branch 16 and the resonant branch 19'. For doing so, switch $S_2$ in FIG. 3 is short-circuited, a switch $S_4$ is inserted between the injection and voltage branches and the branch 17 is replaced by a branch 17' formed by a pulse generator circuit 55, which may be one or more precharged capacitors or any pulse generator of the conventional type, mounted in series with a switch $S_5$. Initially, the switches are open and the capacitor $C_P$ is charged to the voltage $V_o$. When the switch $S_1$ is closed, the branches 16 and 19 are in resonance, so it produced in the loop formed by $C_P$, $L_1$ and $L_2$, a current waveform $I_{L2}$ and a voltage waveform $V_{L2}$ of 60 Hz. These waveforms are shown in FIG. 12. At a desired phase angle $\phi$, the switch $S_5$ is closed to cause sparkover of the arrester 15 by the voltage and current impulse generated by the circuit 55 in the same way as shown in FIG. 4, and, at the same time or little after, the switch $S_4$ is closed to generate the follow current. Therefore, the generator shown in FIG. 11 allows to simulate the operating conditions of the arrester at any phase angle $\phi$ of the rated voltage of a power system.

In conclusion, one of the major advantages of the test generator according to the present invention resides in its cost which is much lower than that of prior art generators. It is due mainly to the use of capacitors as power sources instead of transformers or short-circuit generators. This sole factor allows a cost of the power source which is 2 to 4% of that of ordinary sources. Furthermore, the test generator according to the present invention enables to perform tests at high voltages and power levels that would otherwise be economically unfeasible with the prior generators. Duty cycle tests or forced repetitive 60 Hz overvoltage tests will, from now on, be possible on complete arresters used in high voltage systems. Up until now, the prior circuits could only perform these tests on a fraction of high voltage surge arresters.

The generator described above allows to perform the tests not only on surge arresters but also on other types of protection devices such as fuses and current limiting breakers.

I claim:

1. A test generator for simulating operating conditions of a protection device useful in low, high or very high voltage power systems, comprising a single voltage source; a voltage branch connected to said protection device for producing a sparkover voltage across the terminals of said device; an injection branch, including said single voltage source, mounted in parallel with said voltage branch for generating across the protection device a follow current of a value corresponding to the value of the current injected by the said power system in said protection device when the latter is on duty; and a resonant branch operatively connected to said injection branch for producing across the terminals of the protection device under test an alternating voltage corresponding to the voltage of said power system, said resonant branch being set into operation at a time not exceeding interruption of said follow current.

2. A test generator as claimed in claim 1, wherein said voltage branch comprises a capacitance.

3. A test generator as claimed in claim 1, wherein said injection branch comprises said voltage source connected in series with an inductance and a switch means.

4. A test generator as claimed in claim 1, wherein said resonant branch comprises a high value inductance connected in series with a switch means.

5. A test generator as claimed in claim 1, further comprising a resistive branch inserted between said voltage branch and said protection device to control the intensity of the follow current generated by the injection branch.

6. A test generator as claimed in claim 1, wherein the voltage branch comprises a first and second capacitance connected in series, the two capacitances being mounted in derivation with the protection device, one of the terminals of the protection device being connected to a junction point of the two capacitances across a high ohmic value resistive element, and, to a terminal of one of the capacitances, other than the junction point, through a switch means.

7. A test generator as claimed in claim 1, wherein a switch is inserted between the injection branch and the resonant branch for achieving repetitive tests on said protection device.

8. A test generator as claimed in claim 7, further comprising a set of resistive elements connected in series with the protection device to control the intensity of the follow current injected in the device, said resistive elements being mounted in parallel with respect to one another and each of the resistive elements, except one, being connected in series with a switch means.

9. A test generator as claimed in claim 1, wherein the injection branch comprises, for the simulation of a long transmission line of a power system, a set of injection circuits where each one produces a fraction of the follow current injected in said protection device, each injection circuit including a series inductance and a parallel capacitance in the set of said series connected circuits, and a switch connected in series with the set of the injection circuits.

10. A test generator as claimed in claim 1, wherein the said voltage branch comprises a pulse generating circuit for generating said sparkover voltage.

11. A test generator as claimed in claim 10, wherein a first switch is connected in series with said pulse generating circuit and a second switch is inserted between said injection branch and said voltage branch.

12. A process for simulating operation conditions of a protection device useful in a low, high or very high power system by means of a test generator including a voltage branch, an injection branch and a resonant branch, comprising the steps of providing a single voltage source in said injection branch;

actuating the protection device by applying across its terminals a sparkover voltage generated by said voltage branch, the latter being connected in parallel with said single voltage source;

injecting in said device a follow current generated from said single voltage source;

causing resonance of said injection branch and said resonant branch to produce an alternating voltage across the terminals of the protection device, said alternating voltage corresponding to the voltage under which the power system and the protection device operate, the resonance causing step being effective at a time not exceeding interruption of said follow current injected in said protection device.

13. A process as claimed in claim 12, wherein said resonating step is operative at the same time as said step of injecting the follow current.

14. A process as claimed in claim 12, characterized in that the intensity of the follow current injected in said device is controlled by means of a resistive branch mounted in series with the protection device.

15. A process as claimed in claim 12, characterized in that the resonant branch is causing in resonance with the injection branch at an instant which occurs before the interruption of the follow current flowing through the protection device.

16. A process as claimed in claim 12, characterized in that, immediately after the sparkover of the device, the voltage across its terminals is increased so as to produce a very high value current impulse.

17. A process as claimed in claim 12, characterized in that the current flowing in the resonant branch is interrupted when it reaches a zero value which corresponds to a maximum value of the voltage across the resonant branch, this voltage having then the same polarity as the initial charged voltage of the injection branch.

18. A process as claimed in claim 17, characterized in that resonance between the resonant branch and the injection branch is set and interrupted repetitively so as to produce tests at repetition on the protection device.

19. A process as claimed in claim 18, characterized in that the intensity of the follow current flowing through the protection device is regulated by means of a resistive circuit mounted in series with the device, and wherein the resistance value of the resistive circuit is reduced progressively after each of the repetitive tests.

20. A process as claimed in claim 12, characterized in that, in order to simulate the operating conditions of the protection device at any phase angle of the resonance voltage, the resonating step is performed before the steps of actuating the device and injecting the follow current.

21. A process as claimed in claim 20, characterized in that the step of injecting the follow current is accomplished at the same time as the step of actuating the protection device.

22. A process as claimed in claim 20, characterized in that the step of injecting the follow current takes place immediately after the step of actuating the protection device.

* * * * *